(12) United States Patent
Boehler

(10) Patent No.: US 7,171,596 B2
(45) Date of Patent: Jan. 30, 2007

(54) CIRCUIT AND METHOD FOR TESTING EMBEDDED DRAM CIRCUITS THROUGH DIRECT ACCESS MODE

(75) Inventor: Thomas Boehler, Oberhaching (DE)

(73) Assignee: Infineon Technologies AG, Munich (DE)

( * ) Notice: Subject to any disclaimer, the term of this patent is extended or adjusted under 35 U.S.C. 154(b) by 492 days.

(21) Appl. No.: 10/241,032

(22) Filed: Sep. 11, 2002

(65) Prior Publication Data

US 2004/0049720 A1   Mar. 11, 2004

(51) Int. Cl.
G11C 29/00 (2006.01)
G01R 31/28 (2006.01)

(52) U.S. Cl. .................... 714/718; 714/733
(58) Field of Classification Search ............... 714/710, 714/711, 718, 723, 724, 726, 727, 733, 730; 365/201
See application file for complete search history.

(56) References Cited

U.S. PATENT DOCUMENTS

| 4,481,627 A | 11/1984 | Beauchesne et al. ........... 371/21 |
| 6,044,481 A | 3/2000 | Kornachuk et al. ......... 714/724 |
| 6,286,115 B1 | 9/2001 | Stubbs ....................... 714/718 |
| 6,496,947 B1 * | 12/2002 | Schwarz .................... 714/30 |
| 6,668,347 B1 * | 12/2003 | Babella et al. .............. 714/733 |
| 6,901,542 B2 * | 5/2005 | Bartenstein et al. ........ 714/719 |
| 2001/0003051 A1 | 6/2001 | Yoshizawa | |

FOREIGN PATENT DOCUMENTS

| EP | 0480421 | 4/1992 |
| WO | WO0101422 | 1/2001 |

OTHER PUBLICATIONS

PCT International Search Report.

* cited by examiner

Primary Examiner—James C Kerveros
(74) Attorney, Agent, or Firm—Slater & Matsil, L.L.P.

(57) ABSTRACT

A circuit and method for testing an eDRAM through a test controller with direct access (DA) mode logic is provided. The circuit and method of the present invention allows the testing of eDRAMs with a conventional memory tester. The present invention provides a semiconductor device including an embedded dynamic random access memory (eDRAM) for storing data, the eDram including a plurality of memory cells, and a test controller for testing the plurality of memory cells to determine if the cells are defective, the test controller including built-in self-test (BIST) logic circuitry for performing tests and for interfacing to a logic tester, and direct access mode logic circuitry for interfacing the eDRAM with an external memory tester. The test controller further comprises a multiplexer for multiplexing data, commands, and addresses from the BIST logic circuitry and the direct access mode logic circuitry to the eDRAM.

5 Claims, 6 Drawing Sheets

CIRCUIT AND METHOD FOR TESTING EMBEDDED DRAM CIRCUITS THROUGH DIRECT ACCESS MODE

BACKGROUND OF THE INVENTION

1. Field of the Invention

The present invention relates generally to semiconductor device design, and more particularly, to a circuit and method for testing an embedded dynamic random access memory (eDRAM) circuit through a test controller with Direct Access mode (DA mode) logic.

2. Description of the Related Art

To reach a fast product ramp up and a high yield, any standard DRAM or embedded DRAM circuit needs intensive testing. Each DRAM contains redundant wordlines and bitlines to enable reparability of defective memory cells. Most of the commonly used DRAM tests are used to find all possible storage cell failures and then collect all these failures in a so-called fail bit map. With this fail bit map, an external tester calculates the best usage of the on-chip redundancy.

DRAMs embedded into ASICs (Application Specific Integrated Circuits) require different test strategies than standalone commodity DRAMs. Embedded DRAMs (eDRAM) often contain a test controller and/or a BIST (Built-In Self-Test) circuit to simplify the testing. Commodity DRAM's normally do not contain any additional test circuits and are tested through a memory tester, whereas eDRAM's are tested together with the other ASIC circuit parts through a logic tester.

FIG. 6 illustrates an example of a typical implementation of a test system for testing an ASIC (Application Specific Integrated Circuit) 601 containing an embedded DRAM 603 (eDRAM). The eDRAM is testable through an on-chip test controller 602 with BIST functionality. The BIST logic circuitry contains test programs and redundancy algorithms to decide if the eDRAM 603 passed or failed the test, i.e., whether the eDRAM is good or bad. An external logic tester 600 could operate this test controller 602 by serially scanning information in (via scan in data line 606), and out (via scan out data line 608) of the chip. Subsequently, the test controller 602 will issue a pass/fail signal via line 610.

However, the test controller with BIST functionality has one major drawback. There is no possibility to collect a fail bit map and to build in complex redundancy calculation methods for enhanced repairability of the ASIC. Low volume products (e.g., ASICs) with a small amount of eDRAM may be acceptable with reduced testability and/or a lower yield. But on high volume products with a larger amount of eDRAM, a high yielding eDRAM is a major contribution to a cost efficient product.

Accordingly, it would be desirable and highly advantageous to have a circuit and method for testing embedded DRAMs on an ASIC which employs a conventional memory tester and has the capability to collect a fail bit map to enable repairability.

SUMMARY OF THE INVENTION

It is an object of the present invention to provide a test circuit for direct access to an embedded DRAM (eDRAM) on an ASIC by an external memory tester.

It is another object of the present invention to provide a circuit and method for testing an eDRAM where a fail bit map can be generated.

The present invention provides a circuit and method for testing an eDRAM through a test controller with direct access (DA) mode logic. The circuit and method of the present invention allows the testing of eDRAMs with a conventional memory tester.

Accordingly, it is an aspect of the present invention to provide a semiconductor device including an embedded dynamic random access memory (eDRAM) for storing data, the eDRAM including a plurality of memory cells; and a test controller for testing the plurality of memory cells to determine if the cells are defective, the test controller including built-in self-test (BIST) logic circuitry for performing tests and for interfacing to a logic tester; and direct access mode logic circuitry for interfacing the eDRAM with an external memory tester.

In another aspect of the present invention, the test controller further includes a multiplexer for multiplexing data, commands, and addresses from the BIST logic circuitry and the direct access mode logic circuitry to the eDRAM.

In another aspect of the present invention, the direct-access mode logic circuitry further includes a data multiplexer for receiving a test data pattern from the external memory tester, for expanding the test data to a bus width of the eDRAM, and sending the expanded data to the eDRAM; an address multiplexer for receiving addresses to test; and a command decoder for sending commands to the eDRAM and for controlling the data multiplexer and address multiplexer. The direct access mode logic circuitry further includes a register bank for storing bank addresses, a redundant row address bit, and a highest row address bit, wherein the addresses are accessed upon a register load command from the command decoder.

In another aspect of the present invention, the data multiplexer is adapted for outputting test results to the external tester.

In yet another aspect of the present invention, the semiconductor device further includes a plurality of eDRAMs and a plurality of test controllers, wherein each of the plurality of eDRAMS is operatively coupled to one of the plurality of test controllers. Each of the plurality of test controllers include a register for storing an ID of an eDRAM.

In still another aspect of the present invention, a system for testing a semiconductor device is provided including an external memory tester for generating test patterns; and an application specific integrated circuit (ASIC) including at least one embedded dynamic random access memory (eDRAM) for storing data, the eDRAM including a plurality of memory cells; a test controller for testing the plurality of memory cells to determine if the cells are defective, the test controller including built-in self-test (BIST) logic circuitry for performing tests and for interfacing to a logic tester, and direct access mode logic circuitry for interfacing the eDRAM with the external memory tester. The direct access mode logic circuitry further includes a data multiplexer for receiving a test data pattern from the external memory tester, for expanding the test data to a bus width of the eDRAM, and sending the expanded data to the eDRAM; an address multiplexer for receiving addresses to test; and a command decoder for sending commands to the eDRAM and for controlling the data multiplexer and address multiplexer.

In another aspect of the present invention, the data multiplexer is adapted for outputting test results to the external tester and the external tester is adapted for generating a fail bit map of the at least one eDRAM and for determining redundancy algorithms to repair any defective cells of the at least one eDRAM.

In a further aspect of the present invention, the external tester is adapted for issuing a broadcast command, the broadcast command including IDs of eDRAMS of the plurality of eDRAMS to be tested.

In still a further aspect of the present invention, a method for testing a semiconductor device is provided. The method including the steps of providing a semiconductor device including an embedded dynamic random access memory (eDRAM) for storing data, the eDRAM including a plurality of memory cells, and a test controller for testing the plurality of memory cells to determine if the cells are defective, the test controller including built-in self-test (BIST) logic circuitry for performing tests and for interfacing to a logic tester; and direct access mode logic circuitry for interfacing the eDRAM with an external memory tester; determining if the semiconductor device is in test mode; if the semiconductor device is in the test mode, determining whether to use the BIST logic circuitry or direct access mode logic circuitry; and performing a defect test on the semiconductor device.

In another aspect of the method, if the BIST logic circuitry is used, the method further includes the steps of initiating a BIST test from the external logic tester; receiving an end of test (EOT) signal at the external logic tester; receiving a pass/fail signal from the BIST logic circuitry; and determining if the semiconductor device is good or bad.

In still another aspect of the method, if the direct access mode logic circuitry is used, the method further includes the steps of multiplexing data from the external tester to a bus width of the semiconductor device; multiplexing addresses from the external tester, the addresses specifying the memory cells to be tested; and outputting to the external memory tester test results of the memory cells.

In another aspect of the method, the method further includes the steps of generating a fail bit map from the test results, calculating redundancy algorithms, and repairing defective memory cells using the fail bit map and redundancy algorithms.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described herein below with reference to the accompanying drawings. In the following description, well-known functions or constructions are not described in detail since they would obscure the invention in unnecessary detail.

Figure 1:
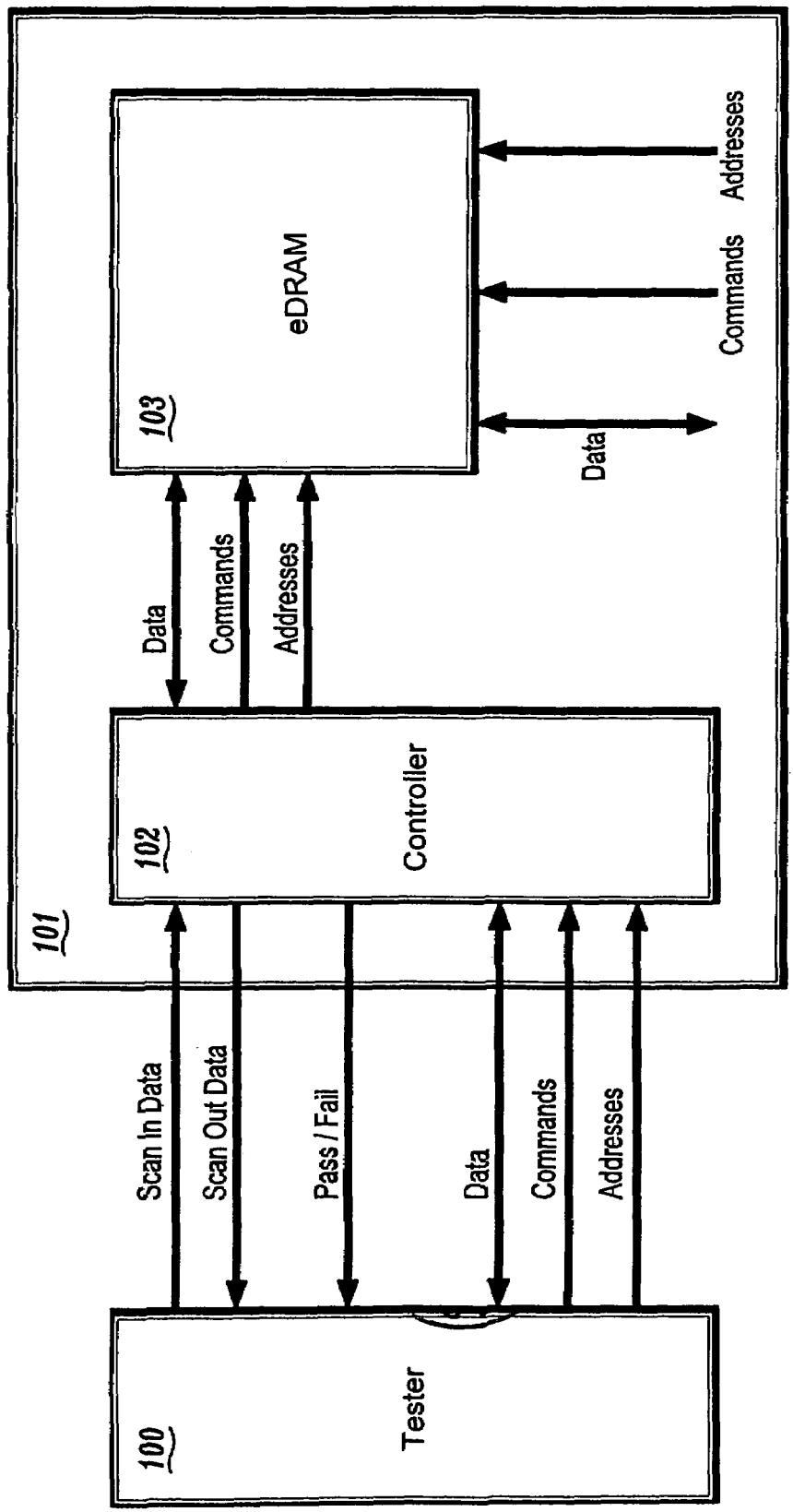
FIG. 1 is a block diagram of a test system including a memory device having a test controller with Direct Access mode logic in accordance with the present invention.

The present invention provides a circuit and method for testing an embedded DRAM (eDRAM) circuit through a test controller with Direct Access mode (DA mode) logic. FIG. 1 is a block diagram of a test system including a memory device, e.g. an eDRAM, having a test controller with Direct Access mode logic in accordance with the present invention. Referring to FIG. 1, a memory or logic tester 100 is coupled to an ASIC (Application Specific Integrated Circuit) 101 including a test controller 102 and at least one embedded DRAM (eDRAM) 103. The eDRAM 103 includes a plurality of wordlines intersected by a plurality of bitlines having memory cells arranged at respective intersections of the wordlines and bitlines. The test controller 102 further includes Direct Access (DA) mode logic as an add-on to an existing BIST circuit, wherein both circuitries are independent from each other. The test controller 102 with DA mode logic can now interact with the conventional logic or memory tester 100. Connecting the DA mode logic with a memory tester 100 now enables the collection of the eDRAM fail bit map. Depending on the current product implementation, the best-suited test approach, i.e., BIST or DA mode, could be chosen. For example, in a product's ramp up phase and for detailed failure analysis, the DA mode would be utilized, whereas in a volume production phase, the BIST approach would be more useful. In the product ramp up phase and for a high volume product, the fail bit map could be captured and complex redundancy algorithms calculated by the memory tester which will lead to a better yield.

Figure 2:
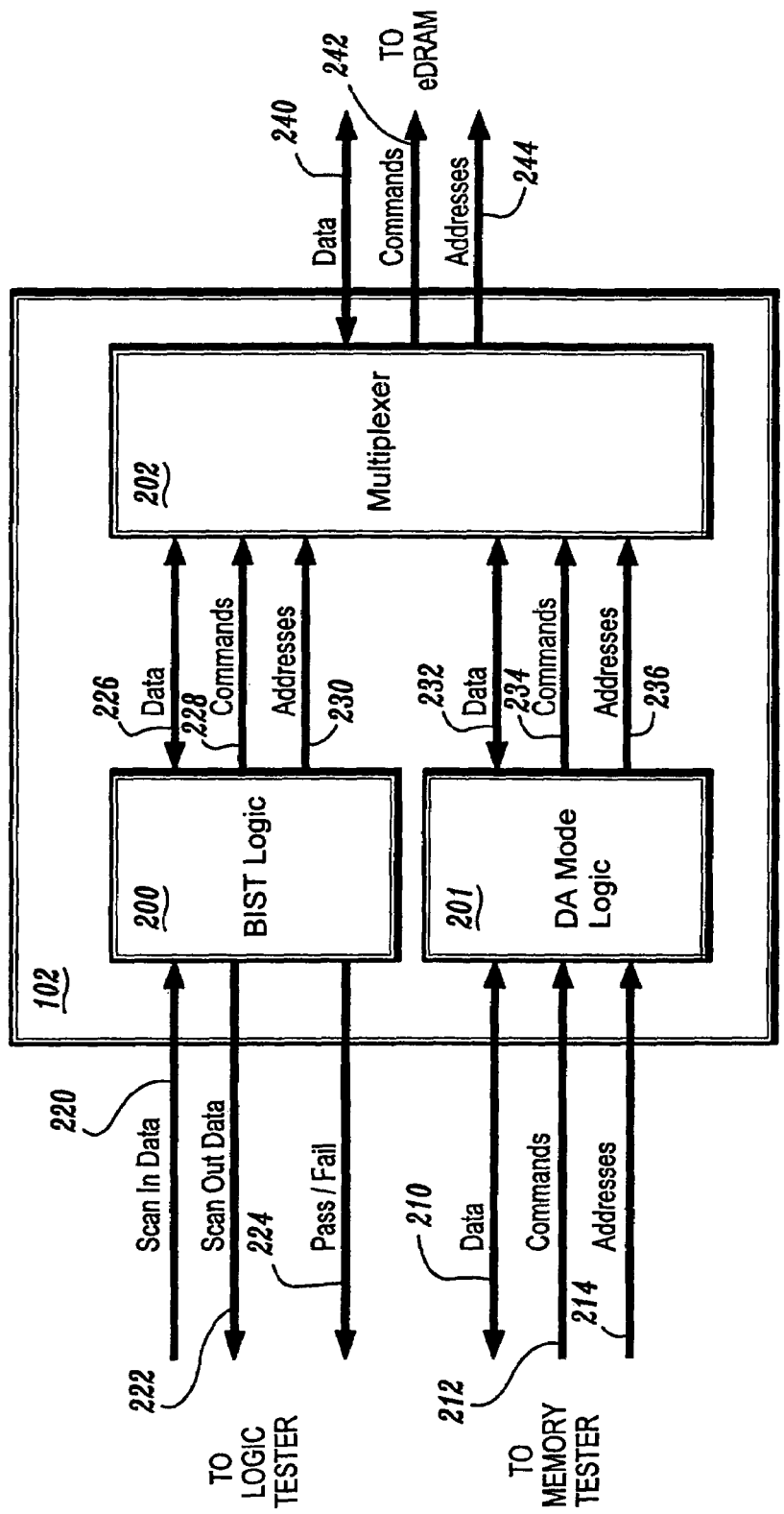
FIG. 2 is a block diagram of the test controller with Direct Access mode logic in accordance with the present invention.

FIG. 2 illustrates a structure of the test controller 102 with DA mode logic in more detail. The test controller 102 includes BIST logic 200, Direct Access mode logic 201 and a multiplexer 202. The BIST logic 200 and the DA mode logic 201 are two separate entities. The DA mode logic 201 is capable of interfacing to a memory tester through data bus 210, command bus 212 and address bus 214, whereas the BIST logic 200 has a logic tester interface including scan in data line 220, scan out data line 222 and pass/fail signal line 224. The data, commands and addresses, generated from both the BIST logic 200 (data 226, commands 228 and addresses 230) and DA mode logic 201 (data 232, commands 234 and addresses 236), are multiplexed to one common interface, i.e., the multiplexer 202, and outputted via data bus 240, command bus 242 and address bus 244 to the eDRAM. The user can choose externally between the two test modes through dedicated mode signals. Two external pins, B_MOD<1> and B_MOD<0>, are used to distinguish between the different modes as illustrated below in Table 1:

TABLE 1

| B_MOD<1> | B_MOD<0> | Mode |
| --- | --- | --- |
| 0 | 0 | ASIC mode |
| 0 | 1 | DA mode |
| 1 | 0 | BIST postfuse mode |
| 1 | 1 | BIST prefuse mode |

For embedded DRAMs (eDRAMs), the pin limitation is a major driver for specifying a certain tester eDRAM interface. Today's technologies offer very large and wide eDRAMs (e.g. up to 32 Mb with 256 bit data width). To collect a bit fail map and interface an external memory tester, all data has to be brought to the outside of the chip or integrated circuit. The present invention overcomes this problem with a very compact protocol, using only 23 pins to interface with an external memory tester, e.g., 10 pins for data, 4 pins for commands, and 9 pins for addresses.

Figure 3:
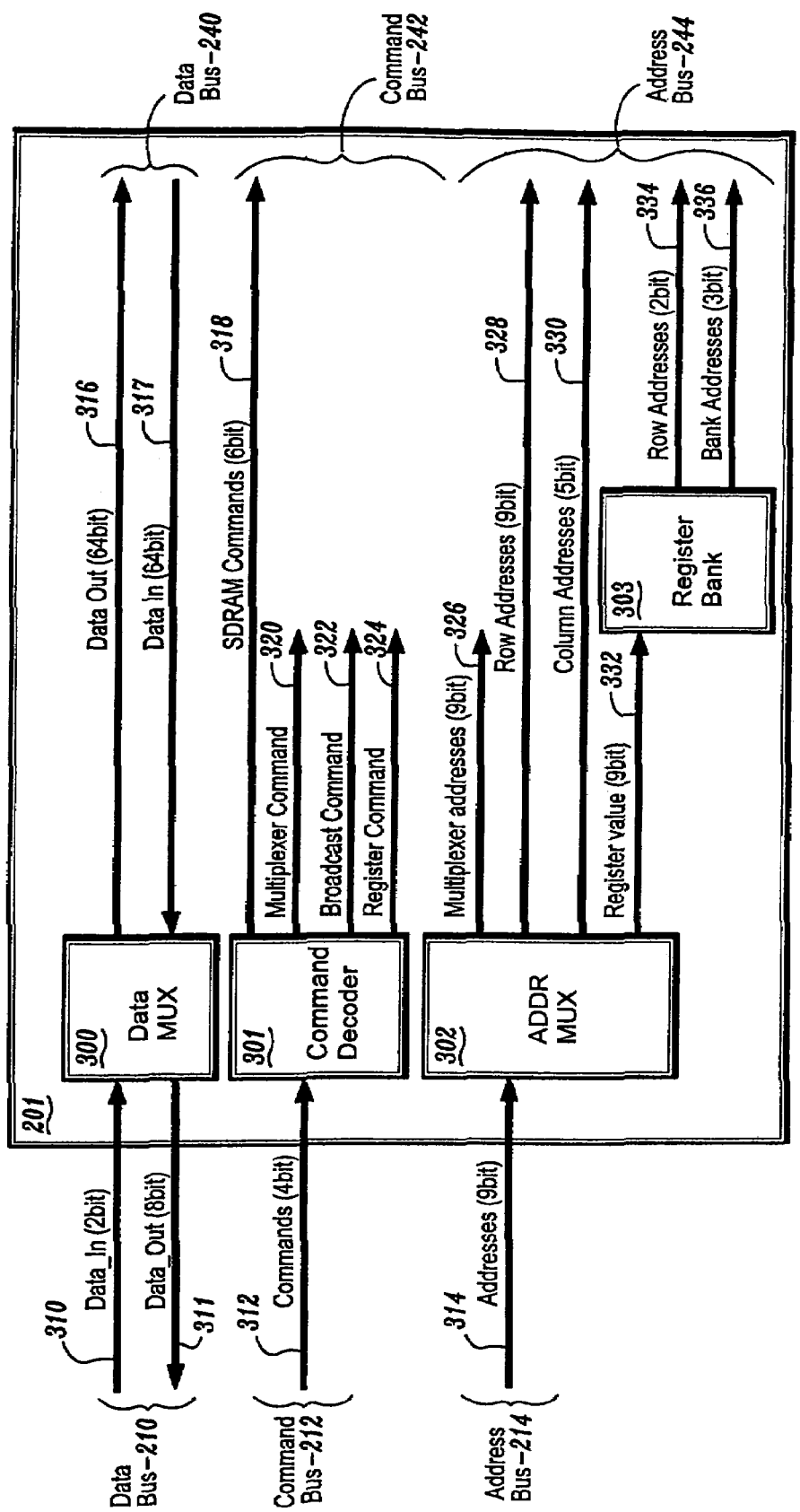
FIG. 3 is a block diagram of a Direct Access mode logic circuit in accordance with the present invention.

FIG. 3 shows the detailed structure of the DA mode logic 201. The DA mode logic 201 includes a data multiplexer 300 for multiplexing data received from the external tester, a command decoder 301 for decoding commands received from the external tester, an address multiplexer 302 for multiplexing address received from the external tester and a register bank 303. The data multiplexer 300 will expand 2 data_in bits 310, received on data bus 210, to the whole bus width (here, 64 I/O eDRAM) by replicating these bits 317. Note, the information from the two data bits is sufficient for the most used data pattern to characterize and debug an eDRAM. Data_out 316 read from the eDRAM are stored in a register included in the data multiplexer 300 and will be sent in 8 bit packets 311 to the external memory tester (this means for a 64 I/O eDRAM, 8 cycles are needed to read out all the data).

The command decoder receives commands (4 bit) via command bus 212 and is capable of sending all needed SDRAM commands 318 to the eDRAM and used to control the data output multiplexer 300 via multiplexer command line 320, the register bank 303 via register command line 324 and to handle a broadcast function via broadcast command line 322.

The address multiplexer 302 is used to cut down needed address pins. The eDRAM address space could be divided and tested in smaller addressable units. The test controller could address eDRAM's with up to 32 M Bits; with the current architecture (128 I/O's), 10 Row addresses, 3 bank addresses and 5 Column addresses are needed. In addition, to test the redundant rows, one more row address has to be addressed (i.e., 32 MB=2^(row addresses)*2^(bank addresses) 2^(column addresses)* I/O). To cut down the number of needed address pins, the address bus 314 is fixed to 9 bits. The address multiplexer 302 is then employed to switch the address bus 314 to the row address bus 328, the column address bus 330 or the register bus 332 as needed so all addresses of the eDRAM can be accessed with only 9 pins.

In operation, a register load command will load bank address (3-bit) 336, a redundant row bit and a highest row address bit 334 to the register 303. The row addresses 334 and bank addresses 336 are subsequently sent to the eDRAM upon a command from the command decoder 301 via register command bus 324. All other row and column addresses are directly driven from address multiplexer 302 via row address bus 328 and column address bus 330.

Therefore, as described above and shown in FIG. 3, an embodiment of the test controller allows access to an external memory tester using only 23 pins: 10 pins for data via data bus 210 (data_in (2 bit) and data_out (8 bit); 4 pins for commands via command bus 212; and 9 pins for address via address bus 214.

Figure 4:
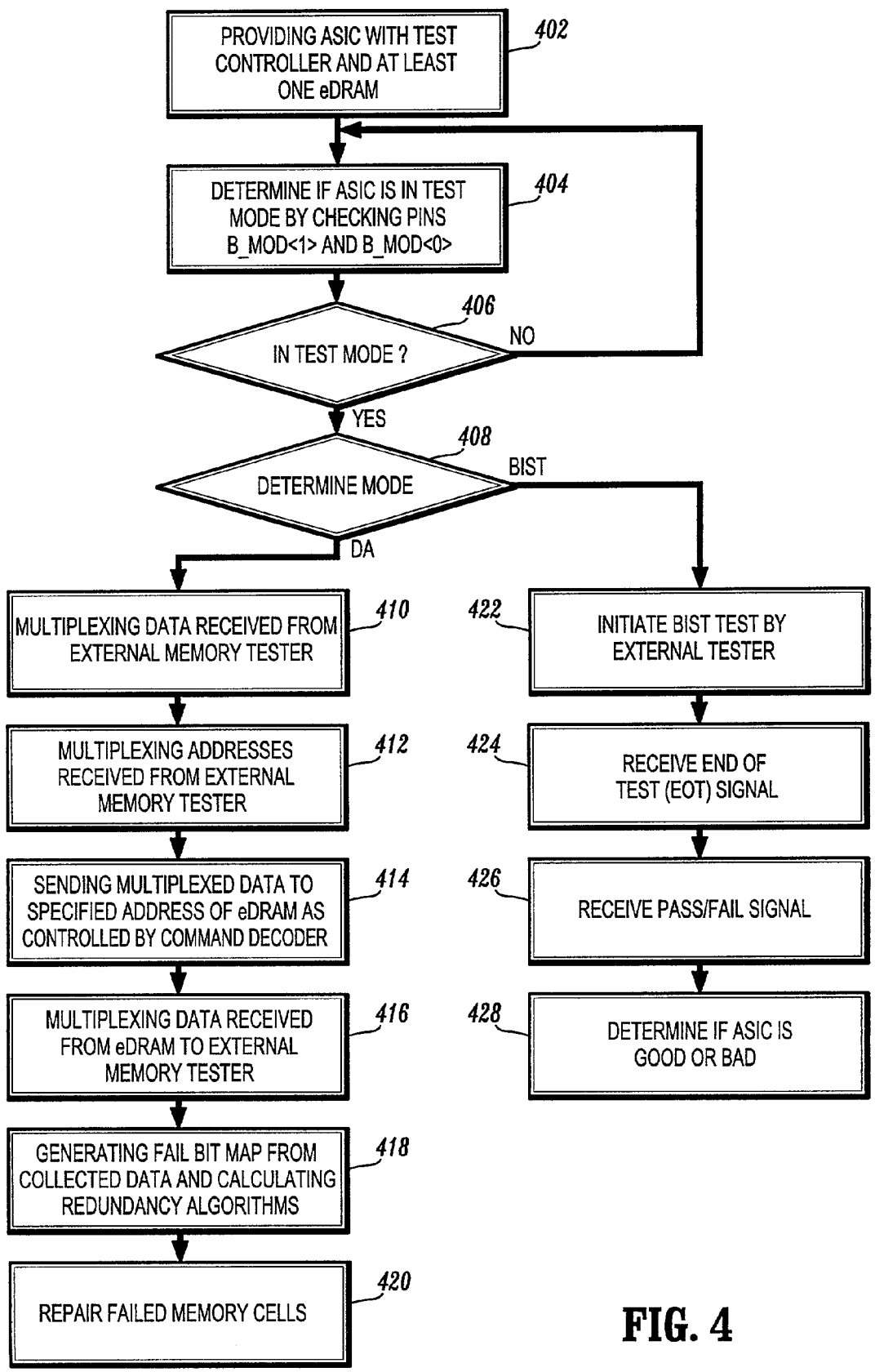
FIG. 4 is a flowchart illustrating a method of testing a memory device in accordance with the present invention.

Referring to FIG. 4, a method of testing a memory device in accordance with the present invention will be described. In step 402, an ASIC is provided having a test controller and at least one eDRAM as described above. Two external pins, namely, B_MOD<1> and B_MOD<0>, are checked to determine if the ASIC is in a test mode (step 404). In step 406, if the ASIC is not in a test mode, the method returns to step 404 awaiting for a test mode to be initiated. If in step 406, it is determined that the ASIC is in a test mode, step 408 will determine if the ASIC is in a BIST test mode or a Direct Access (DA) test mode, as determined by TABLE 1 above.

If in step 408, it is determined that the ASIC is in a DA mode test, an external memory tester will send test data to the ASIC where it will be multiplexed to the bus width of the eDRAM (step 410). Then, the external memory tester will send the addresses to be tested to the ASIC where the addresses will be multiplexed by address multiplexer 302 (step 412). The multiplexed data is then sent to the specified address as controlled by the command decoder 301 (step 414). After the test is performed on the eDRAM, data received from the eDRAM is multiplexed to the external tester (step 416) where a fail bit map is generated and redundancy algorithms are calculated (step 418). Once the fail bit map has been generated and the redundancy algorithms determined, any failed memory cell of the eDRAM can now be repaired.

Furthermore, if in step 408 it is determined that the ASIC is in a BIST test mode, the testing of the memory will proceed to step 422. In BIST test mode two scenarios are possible, either the external tester transfers (via scan in) a test program to a BIST engine or a built-in test program (part of the BIST engine itself) is used. In both cases, the external tester then will initiate the BIST to execute the test program (step 422) and wait till the BIST has finished indicated through an end of test (EOT) signal (step 424). In this phase, no data is transferred back to the tester. After the test has finished, a pass/fail signal will indicate if the test failed or not. The logic tester will then receive the pass/fail signal (step 426) and determine if the ASIC is good or bad (step 428).

Figure 5:
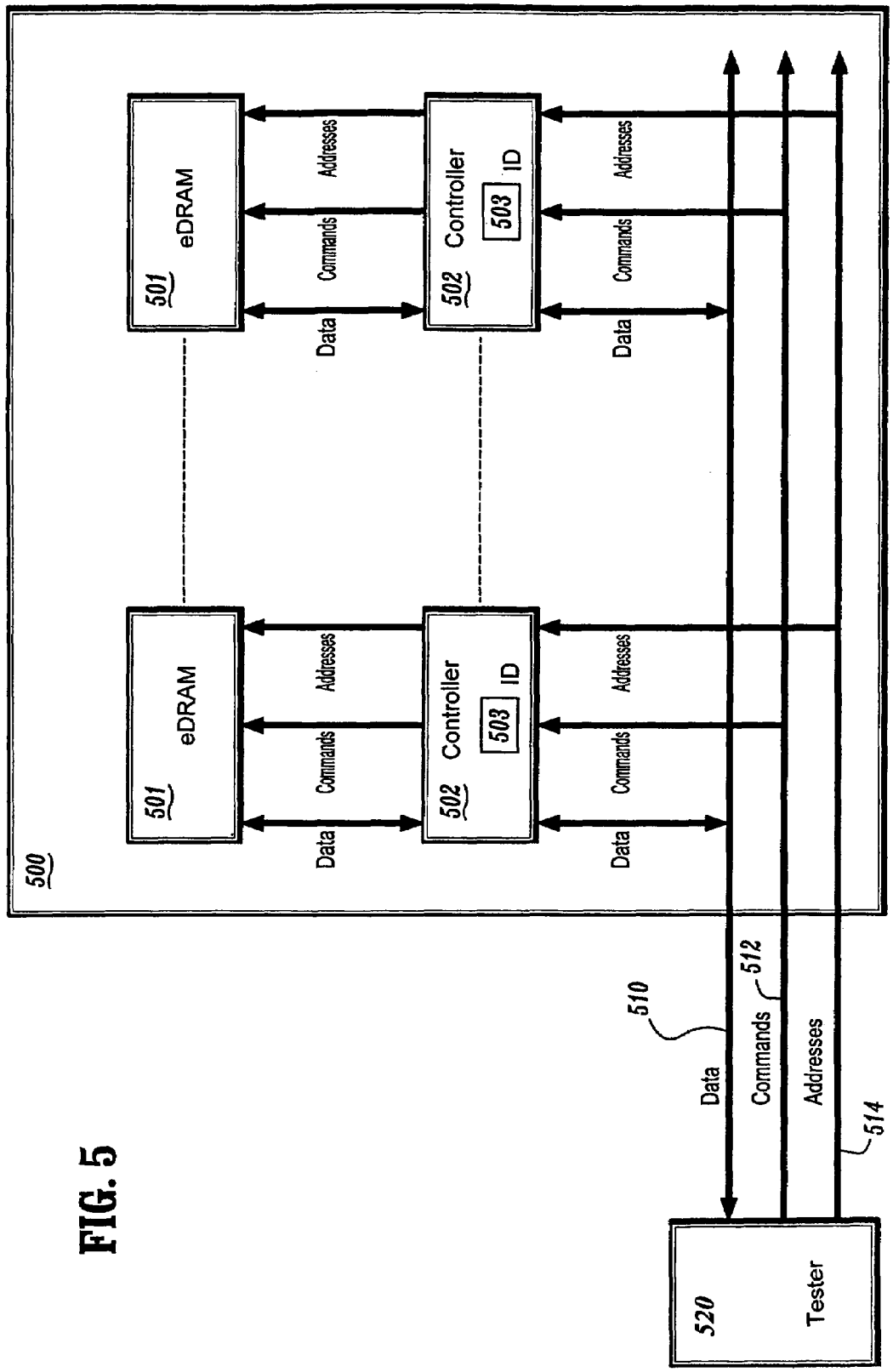
FIG. 5 is a block diagram of a test system including an Application Specific Integrated Circuit (ASIC) having a plurality of memory devices having corresponding test controllers in accordance with the present invention.
Figure 6:
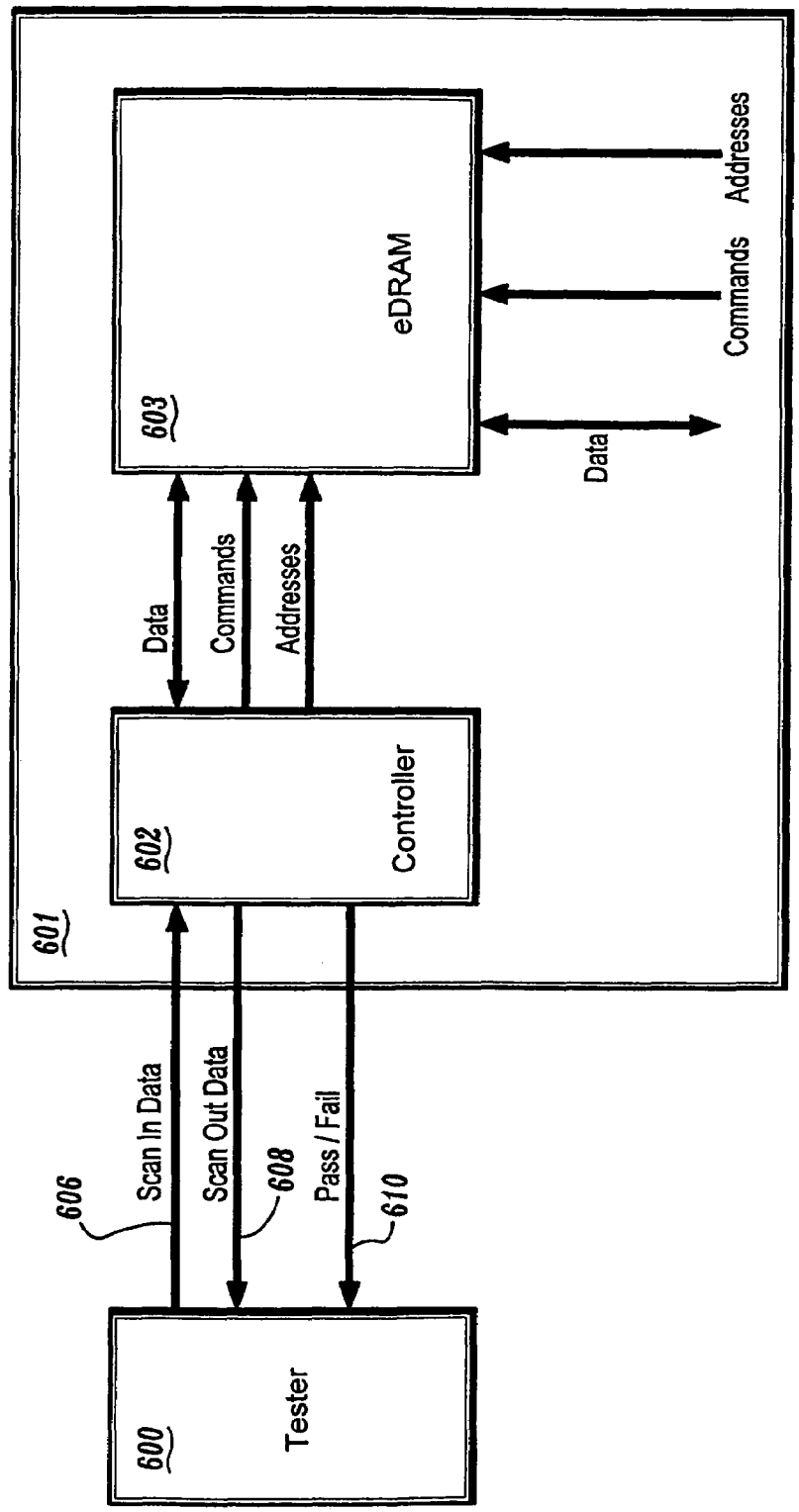
FIG. 6 is a block diagram of a conventional test system including a memory device having a test controller with Built-In Self-Test (BIST) logic.

FIG. 5 shows the present invention in a multi-test controller configuration. Here, an ASIC 500 includes a plurality of eDRAMs 501 and corresponding test controllers 502. The DA mode logic contains broadcast functionality to address this configuration. Each test controller 502 has a chip-ID register 503. Preferably, the chip-ID register is an 11-bit register that stores one bit for each eDRAM present in the current configuration, each bit position is unique for one out of a maximum of 11 eDRAMs (e.g. bit[0]=1 means the first eDRAM will be activated). An 11-bit register is chosen since the broadcast command employed by an external tester 502 uses the 9-bit wide address bus 514 and the 2-bit wide data_in bus of data bus 510 to write to the chip-ID register 503. Therefore, the current configuration could address up to 11 eDRAMS's, which covers the needs of most ASIC currently in use. This allows semiconductor device designers' to build complex ASIC's with up to 11 eDRAM's testable through the same interface.

All test controllers 502 will be connected to the same data 510, command 512 and address 514 bus. The external tester 502 can send the broadcast command that will be transferred to all test controller registers 503. The broadcast command includes an ID that will be compared to each of the chip-ID registers 503. If the ID's match, the test controller will accept commands, otherwise, the test controller will ignore any subsequent commands. This allows the memory tester 520 to write to multiple test controllers in parallel with only one command (test time reduction) and to collect for a read cycle the data from each test controller individually.

The present invention enables testing of an embedded DRAM in the same fashion as a commodity DRAM with a memory tester. Even eDRAM's with very large I/O widths are testable and a fail bit map could be collected through a very small number of additional pins. By combining the new DA mode logic with the existing BIST approach, a very flexible test strategy will be supported and depending on the product the best tester platform could be selected. By offering the multi-test controller of the present invention, a very wide range of applications/products can be reached with the same test concept. Furthermore, the test programs could be kept the same for different products and yield improvement strategies from the commodity DRAM business can be directly used, e.g., same tester platform.

While the invention has been shown and described with reference to certain preferred embodiments thereof, it will be understood by those skilled in the art that various changes in form and detail may be made therein without departing from the spirit and scope of the invention as defined by the appended claims.

What is claimed is:

1. A method for testing a semiconductor device comprising the steps of:
    providing a semiconductor device including an embedded dynamic random access memory (eDRAM) for storing data;
    determining if the semiconductor device is in test mode;
    if the semiconductor device is in the test mode, determining whether to use BIST logic circuitry or direct access mode logic circuitry; and
    performing a dekct test on the semiconductor device using either the BIST logic circuitry or the direct access mode logic circuitry;
    wherein if the direct access mode logic circuitry is used, the method further comprises:
    multiplexing data from the external tester to a bus width of the semiconductor device;
    multiplexing addresses from the external tester, the addresses specifying the memory cells to be tested; and
    outputting to the external memory tester test results of the memory cells.

2. The method as in claim 1, wherein if the BIST logic circuitry is used, the method further comprises:
    initiating a BIST test from a logic tester;
    receiving an end of test (EOT) signal at the logic tester;
    receiving a pass/fail signal from the BIST logic circuitry; and
    determining if the semiconductor device is good or bad.

3. The method as in claim 1, further comprising the step of generating a fail bit map from the test results and calculating redundancy algorithms.

4. The method as in claim 3, further comprising the step of repairing defective memory cells using the fail bit map and redundancy alogrithms.

5. The method as claimed in claim 1 wherein the eDRAM includes a plurality of memory cells and a test controller for testing the plurality of memory cells to determine if the cells are defective, the test controller including built-in self-test (BIST) logic circuitry for performing tests and for interfacing to a logic tester and direct access mode logic circuitry for interfacing the eDRAM with an external memory tester.

* * * * *

UNITED STATES PATENT AND TRADEMARK OFFICE
CERTIFICATE OF CORRECTION

PATENT NO. : 7,171,596 B2 Page 1 of 1
APPLICATION NO. : 10/241032
DATED : January 30, 2007
INVENTOR(S) : Boehler It is certified that error appears in the above-identified patent and that said Letters Patent is hereby corrected as shown below:

Column 7, line 22; delete "dekct" insert --defect--

Signed and Sealed this

Tenth Day of April, 2007

JON W. DUDAS
*Director of the United States Patent and Trademark Office*